United States Patent
Jung et al.

(10) Patent No.: US 8,242,377 B2
(45) Date of Patent: Aug. 14, 2012

(54) PRINTED CIRCUIT BOARD HAVING ELECTROMAGNETIC BANDGAP STRUCTURE

(75) Inventors: Hyo-Jic Jung, Daejeon-si (KR); Han Kim, Yongin-si (KR); Mi-Ja Han, Junjoo-si (KR); Kang-Wook Bong, Seoul (KR); Dae-Hyun Park, Woolsan-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 382 days.

(21) Appl. No.: 12/654,361

(22) Filed: Dec. 17, 2009

(65) Prior Publication Data
US 2011/0067914 A1   Mar. 24, 2011

(30) Foreign Application Priority Data
Sep. 23, 2009  (KR) .................. 10-2009-0090166

(51) Int. Cl.
*H05K 9/00* (2006.01)
*H05K 1/11* (2006.01)

(52) U.S. Cl. ........ 174/256; 174/255; 174/360; 174/376; 361/794; 361/816; 333/12; 333/212; 343/909

(58) Field of Classification Search .......... 174/360, 174/376, 250–267; 361/762–767, 780–795, 361/816, 818; 333/12, 212, 202–205, 236, 333/238, 167, 185, 175, 22 R; 343/909
See application file for complete search history.

(56) References Cited

U.S. PATENT DOCUMENTS

| | | | |
|---|---|---|---|
| 6,198,362 B1 * | 3/2001 | Harada et al. ................. | 333/12 |
| 6,215,372 B1 * | 4/2001 | Novak ............................ | 333/12 |
| 6,329,604 B1 * | 12/2001 | Koya ............................. | 174/255 |
| 6,353,540 B1 * | 3/2002 | Akiba et al. ................... | 361/794 |
| 6,512,181 B2 * | 1/2003 | Okubo et al. ................. | 174/255 |
| 6,798,666 B1 * | 9/2004 | Alexander et al. ........... | 361/766 |
| 6,833,512 B2 * | 12/2004 | Liu ................................ | 174/262 |
| 7,215,007 B2 * | 5/2007 | McKinzie et al. ............ | 257/664 |
| 7,466,560 B2 * | 12/2008 | Hayashi et al. .............. | 361/784 |
| 7,586,444 B2 * | 9/2009 | Berlin et al. ........... | 343/700 MS |
| 7,594,105 B2 * | 9/2009 | Ohsaka .......................... | 713/2 |
| 7,675,729 B2 * | 3/2010 | Anthony et al. .............. | 361/118 |
| 7,843,702 B2 * | 11/2010 | Choi et al. ..................... | 361/763 |
| 7,889,134 B2 * | 2/2011 | McKinzie et al. ...... | 343/700 MS |
| 7,944,320 B2 * | 5/2011 | Han et al. ...................... | 333/12 |
| 8,004,369 B2 * | 8/2011 | Kwon et al. ................... | 333/12 |
| 8,102,219 B2 * | 1/2012 | Koo et al. ..................... | 333/12 |

(Continued)

FOREIGN PATENT DOCUMENTS
KR    10-2009-0060117    6/2009

*Primary Examiner* — Michail V Datskovskiy (57) ABSTRACT

Disclosed is a printed circuit board into which an electromagnetic bandgap structure for blocking a noise is inserted. The electromagnetic bandgap structure can include a first conductor and a second conductor arranged on different planar surfaces, a third conductor arranged on a same planar surface that is different from a planar surface where the second conductor is arranged, and a first stitching via unit configured to connect the first conductor to the third connector through the planar surface where the second conductor is arranged and being electrically separated from the second conductor. The first conductor can include a first plate, a second plate spaced from the first plate, and a second stitching unit configured to electrically connect the first plate to the second plate through a planar surface that is different from a planar surface where the first plate and the second plate are arranged.

4 Claims, 6 Drawing Sheets

U.S. PATENT DOCUMENTS

| | | | |
|---|---|---|---|
| 8,125,290 B2* | 2/2012 | Wu et al. | 333/12 |
| 2005/0104678 A1* | 5/2005 | Shahparnia et al. | 333/12 |
| 2005/0134522 A1* | 6/2005 | Waltho | 343/909 |
| 2005/0205292 A1* | 9/2005 | Rogers et al. | 174/255 |
| 2006/0050491 A1* | 3/2006 | Hayashi et al. | 361/760 |
| 2007/0001926 A1* | 1/2007 | Waltho | 343/909 |
| 2007/0090398 A1* | 4/2007 | McKinzie, III | 257/192 |
| 2007/0136618 A1* | 6/2007 | Ohsaka | 713/323 |
| 2007/0228578 A1* | 10/2007 | Chou | 257/774 |
| 2009/0038840 A1* | 2/2009 | Kim et al. | 174/376 |
| 2009/0039984 A1* | 2/2009 | Kim et al. | 333/212 |
| 2009/0040741 A1* | 2/2009 | Hayashi et al. | 361/794 |
| 2009/0080172 A1* | 3/2009 | Arslan et al. | 361/816 |
| 2009/0135570 A1* | 5/2009 | Chou et al. | 361/782 |
| 2009/0145646 A1* | 6/2009 | Han et al. | 174/260 |
| 2009/0184782 A1* | 7/2009 | Koo et al. | 333/204 |
| 2009/0236141 A1* | 9/2009 | Kim et al. | 174/360 |
| 2009/0267704 A1* | 10/2009 | Chang et al. | 333/175 |
| 2009/0278626 A1* | 11/2009 | Lee | 333/185 |
| 2009/0315648 A1* | 12/2009 | Toyao | 333/238 |
| 2009/0322450 A1* | 12/2009 | Kim et al. | 333/204 |
| 2010/0108373 A1* | 5/2010 | Park | 174/376 |

* cited by examiner

PRINTED CIRCUIT BOARD HAVING ELECTROMAGNETIC BANDGAP STRUCTURE

CROSS-REFERENCE TO RELATED PATENT APPLICATIONS

This application claims the benefit of Korean Patent Application No. 10-2009-0090166, filed on Sep. 23, 2009, in the Korean Intellectual Property Office, the disclosure of which is incorporated herein in their entirety by reference.

BACKGROUND OF THE INVENTION

1. Field of the Invention

The present invention relates to a substrate, more specifically to a noise reducing substrate capable of reducing a noise by using an EBG structure.

2. Background Art

As the operation frequencies of electronic products get higher, the electromagnetic interference (EMI) has been considered as one the chronic noise problems. Especially, the operation frequencies of the electronic products have recently been in a range of several tens MHz to several GHz, and thus it is significantly needed to solve the EMI problem. Specifically, since there has been little study on the solution to a noise generated at an edge of the substrate as the EMI problem of substrate, it is difficult to completely block the noises at the substrate.

Figure 1:
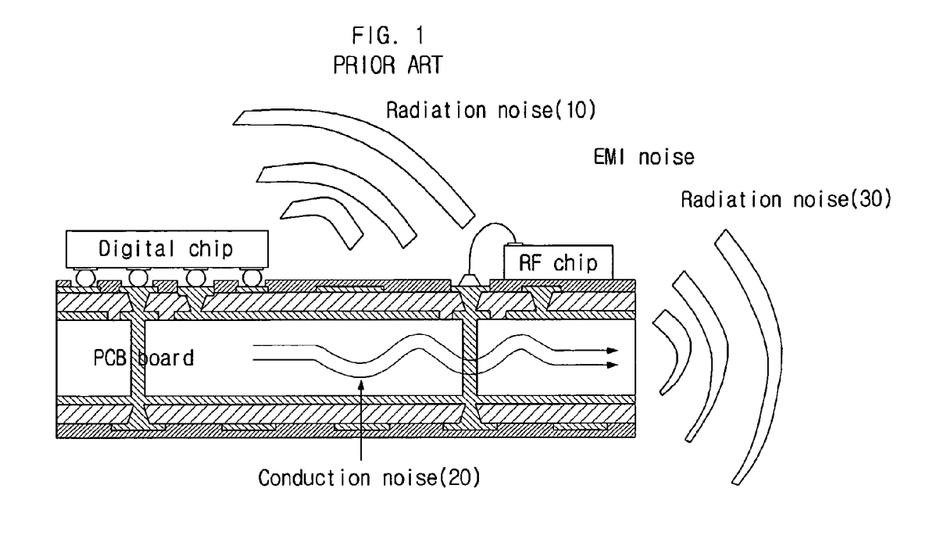
FIG. 1 shows how noises are transferred in a printed circuit board.

The noise problem is caused by an EMI noise, which is the interference between electromagnetic (EM) waves generated at any one of electronic circuits, devices, parts and/or the like and other EM waves generated at another one. As shown in FIG. 1, the EMI noise can be roughly classified into a radiation noise and a conduction noise.

The radiation noise transferred to an upper side (i.e., the mounting surface of an electronic part) of a substrate can be typically prevented by shielding the upper side of the substrate with an electromagnetic protective cap such as a metal cap. In contrast, it is not as easy to prevent the conduction noise. Furthermore, the operation frequencies of digital electronic products get higher, causing the digital electronic products more complex, and thus it is difficult to find the solution.

SUMMARY

The present invention provides an EMI noise reducing printed circuit board that can be advantageous in spatial configuration, manufacturing cost, and power consumption, by easily reducing noises having more various frequency bands.

An aspect of the present invention features a printed circuit board into which an electromagnetic bandgap structure for blocking a noise is inserted. The electromagnetic bandgap structure can include a first conductor and a second conductor arranged on different planar surfaces, a third conductor arranged on a same planar surface that is different from a planar surface where the second conductor is arranged, and a first stitching via unit configured to connect the first conductor to the third connector through the planar surface where the second conductor is arranged and being electrically separated from the second conductor. The first conductor can include a first plate, a second plate spaced from the first plate, and a second stitching unit configured to electrically connect the first plate to the second plate through a planar surface that is different from a planar surface where the first plate and the second plate are arranged.

The second stitching via unit can include a connection pattern arranged on the planar surface that is different from the planar surface where the first plate and the second plate are arranged, and a pair of vias configured to connect opposite ends of the connection pattern to the first plate and the second plate, respectively. The connection pattern can be arranged on the same planar surface as the second conductor.

The first plate can be surrounded by the second plate.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" can be used in describing various elements, but the above elements shall not be restricted to the above terms. The above terms are used only to distinguish one element from the other.

A printed circuit board in accordance with an embodiment of the present invention, as shown in FIG. 1, includes an electromagnetic bandgap structure to prevent an electromagnetic wave generated at any one of electronic circuits, devices and the like (e.g., digital chips) from being transferred to another one of electronic circuits, devices and the like (e.g., radio frequency (RF) chips). That is, such a noise is blocked by the electromagnetic bandgap structure included in the printed circuit board.

Before describing the printed circuit board including the electromagnetic bandgap structure of the present embodiment, the basic structure and principle of the printed circuit board of the present invention will be described with reference to FIG. 2.

Figure 2:
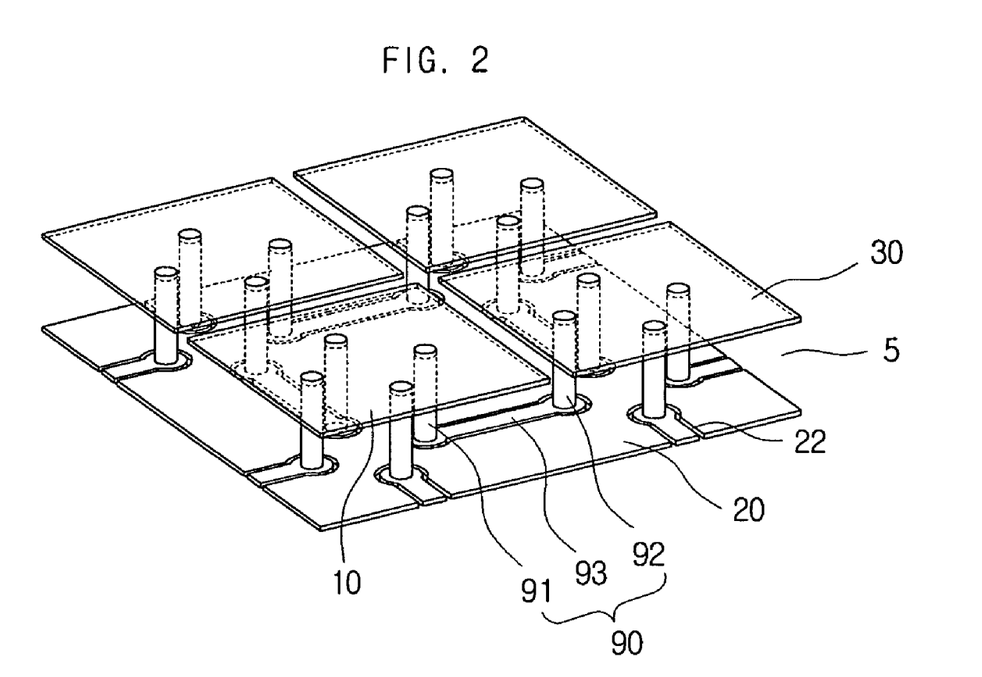
FIG. 2 is a perspective view showing a stitching via type of an electromagnetic bandgap structure.

FIG. 2 is a perspective view showing a stitching via type of an electromagnetic bandgap structure. As shown in FIG. 2, the stitching via type of an electromagnetic bandgap structure can include: a first conductor 10; a second conductor 20 arranged on a planar surface that is different from that of the first conductor 10; a third conductor 30 arranged on a planar surface that is different from that of the second conductor 20; and a first stitching via unit 90 connecting the first conductor 10 to the third conductor 30 through the planar surface on which the second conductor 20 is arranged.

Here, the first stitching via unit 90 is electrically separated from the second conductor 20 by a clearance hole 22 formed on the second conductor 20, and a dielectric layer 5 is interposed between the first conductor 10 and the second conductor 20.

Figure 3:
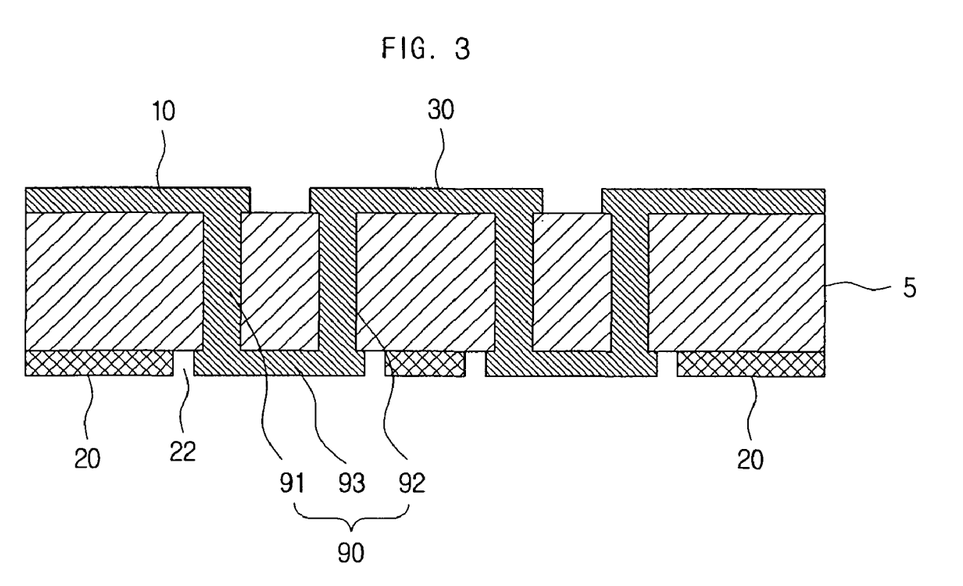
FIG. 3 is a cross sectional view showing a stitching via type of an electromagnetic bandgap structure.

As shown in FIGS. 2 and 3, the first stitching via unit 90 can include a connection pattern 93 arranged on the same planar surface as the second conductor 20 and a pair of vias 91 and 92 connecting opposite ends of the connection pattern 93 to the first conductor 10 and the third conductor 30, respectively.

Here, FIGS. 2 and 3 merely show elements constituting the electromagnetic bandgap structure (i.e., parts constituting a 2-layered electromagnetic bandgap structure including the stitching via unit) for the convenience of illustration. Accordingly, the first, second, and third conductors 10, 20 and 30 shown in FIGS. 2 and 3 may be any two metal layers of a multi-layered printed circuit board. In other words, it should be evident that there can be additional metal layers below the second conductor 20 and above the first and third conductors 10 and 30.

For example, the electromagnetic bandgap structure shown in FIGS. 2 and 3 can be placed between any two metal layers functioning respectively as a power layer and a ground layer in a multi-layered printed circuit board in order to block a conductive noise. Since the conductive noise problem is not limited to the space between a power layer and a ground layer, the electromagnetic bandgap structure can be placed between any two ground layers or power layers placed on different layers from one another in a multi-layered printed circuit board.

The second conductor 20 may be any metal layer for transferring an electric signal in a printed circuit board. For example, the second conductor 20 can be any metal layer functioning as a power layer or a ground layer or any metal layer functioning as a signal layer constituting a signal line.

For example, when the second conductor 20 is a power layer, the first and third conductors 10 and 30 can be electrically connected to a ground layer. When the second conductor 20 is a ground layer, the first and third conductors 10 and 30 can be electrically connected to a power layer. Alternatively, when the second conductor 20 is a signal layer, the first and third conductors 10 and 30 can be electrically connected to a ground layer. When the second conductor 20 is a ground layer, the first and third conductors 10 and 30 can be electrically connected to a signal layer.

The electromagnetic bandgap structure may be adequately arranged in one line or two or more lines at any position where the conductive noise needs to be blocked.

Described below is the principle by which the structure shown in FIG. 2 can function as an electromagnetic bandgap structure blocking a signal of a certain frequency band.

The dielectric layer 5 can be interposed between the first conductor 10 and the third conductor 30. This may cause a capacitance component to be formed between the second conductor 20 and the first and third conductors 10 and 30 and between the adjacent two conductors 10 and 30. Moreover, there can be an inductance component connecting through the via 91→ the connection pattern 93→ the via 92 between the adjacent two conductors 10 and 30 by the first stitching via unit 90.

At this time, the value of the capacitance component can vary according to various factors such as the spaced distances between the second conductor 20 and the first and third conductors 10 and 30 and between the adjacent two conductors 10 and 30, the permittivity of a dielectric material constituting the dielectric layer 5 and the size, shape and area of conductor, etc.

The value of the inductance component can also vary according to various factors such as the shape, length, depth, width and area of the vias 91 and 92 and/or the connection pattern 93. Accordingly, adjusting and designing various aforementioned factors adequately can make it possible to allow the structure of FIGS. 2 and 3 to function as an electromagnetic bandgap structure (i.e. a band stop filter) for removing or blocking a certain noise or a certain signal of a target frequency band. This can be easily understood through the equivalent circuit of FIG. 4.

Figure 4:
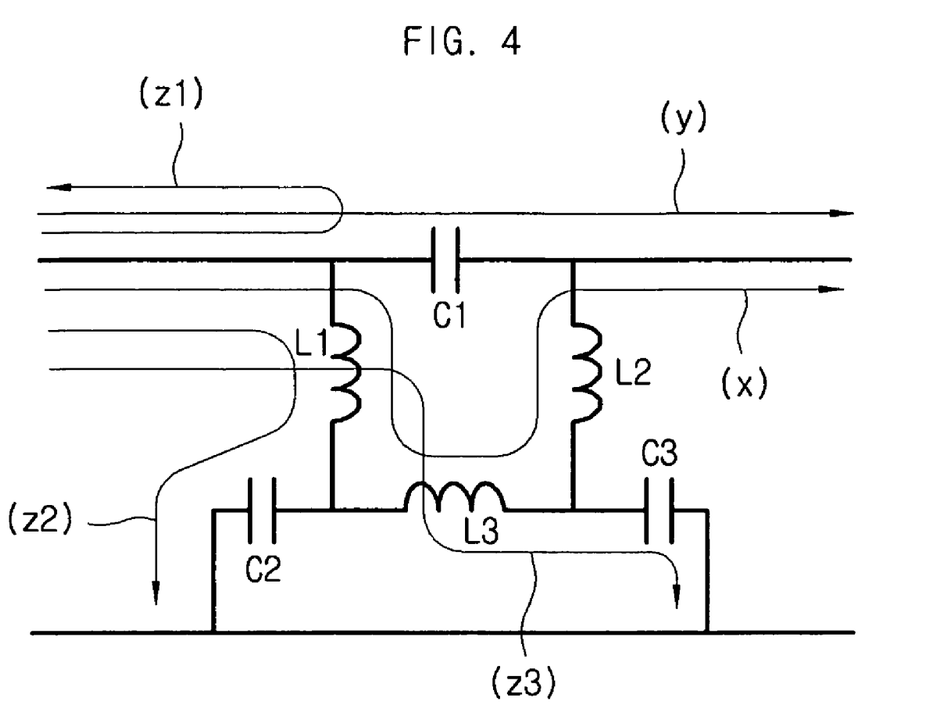
FIG. 4 shows an equivalent circuit of the electromagnetic bandgap structure of FIG. 3.

Comparing the equivalent circuit of FIG. 4 with the electromagnetic bandgap structure of FIG. 3, an inductance component L1 can correspond to the via 91, and an inductance component L2 can correspond to the via 92. An inductance component L3 can correspond to the connection pattern 93. C1 can be a capacitance component by the first and third conductors 10 and 30 and another dielectric layer, which is to be placed above the first and third conductors 10 and 30, and the second conductor 20. C2 and C3 can be capacitance components by the second conductor 20, which is placed on the same planar surface as the connection pattern 93, and another dielectric layer, which is to be placed below the planar surface of the connection pattern 93, and the second conductor 20.

As shown in the equivalent circuit of FIG. 4, the electromagnetic bandgap structure shown in FIGS. 2 and 3 can function as a band stop filter, which blocks a signal of a certain frequency band according to the above equivalent circuit.

In other words, as shown in FIG. 4, a signal x of a low frequency band (refer to FIG. 4) and a signal y of a high frequency band (refer to FIG. 4) can pass through the electromagnetic bandgap structure, and signals z1, z2 and z3 of certain frequency bands (refer to FIG. 4) ranging between the low frequency band and the high frequency band are blocked by the electromagnetic bandgap structure.

Here, it should be noted that, since the electromagnetic bandgap structure shown in FIGS. 2 and 3 has a two-layered structure including the stitching unit 90, it is possible to have wider and more various bandgap frequency bands through a plurality of blocking paths z1, z2 and z3 (refer to FIG. 4) caused by 3 inductance components and 3 capacitance components.

Hereinafter, the structure of a printed circuit board into which the electromagnetic bandgap structure of the present embodiment is inserted will be described in more detail with reference to FIG. 5. Inserted into the printed circuit board of the present embodiment is the stitching via type of an electromagnetic bandgap structure. At this time, the first conductor 10 and/or the third conductor 30 constituting the electromagnetic bandgap structure can have the stitching via structure therein.

Specifically, the first conductor 10 can include: a first plate 11; a second plate 12 spaced from the first plate 11; and a second stitching via unit 16 electrically connecting the first plate 11 to the second plate 12 through a planar surface that is different from a planar surface where the first and second plates 11 and 12 are arranged.

At this time, the second stitching via unit 16 can include: a connection pattern 15 arranged on a planar surface that is different from the planar surface where the first and the second plate 11 and 12 are arranged; and a pair of vias 13 and 14 connecting opposite ends of the connection pattern 15 to the first plate 11 and the second plate 12, respectively. Here, the connection pattern 15 can be arranged on the same planar surface as the second conductor 20. In this case, a two-layered structure can be maintained. The connection pattern 15 can be electrically separated from the second conductor 20 by the clearance hole 22.

Figure 5:
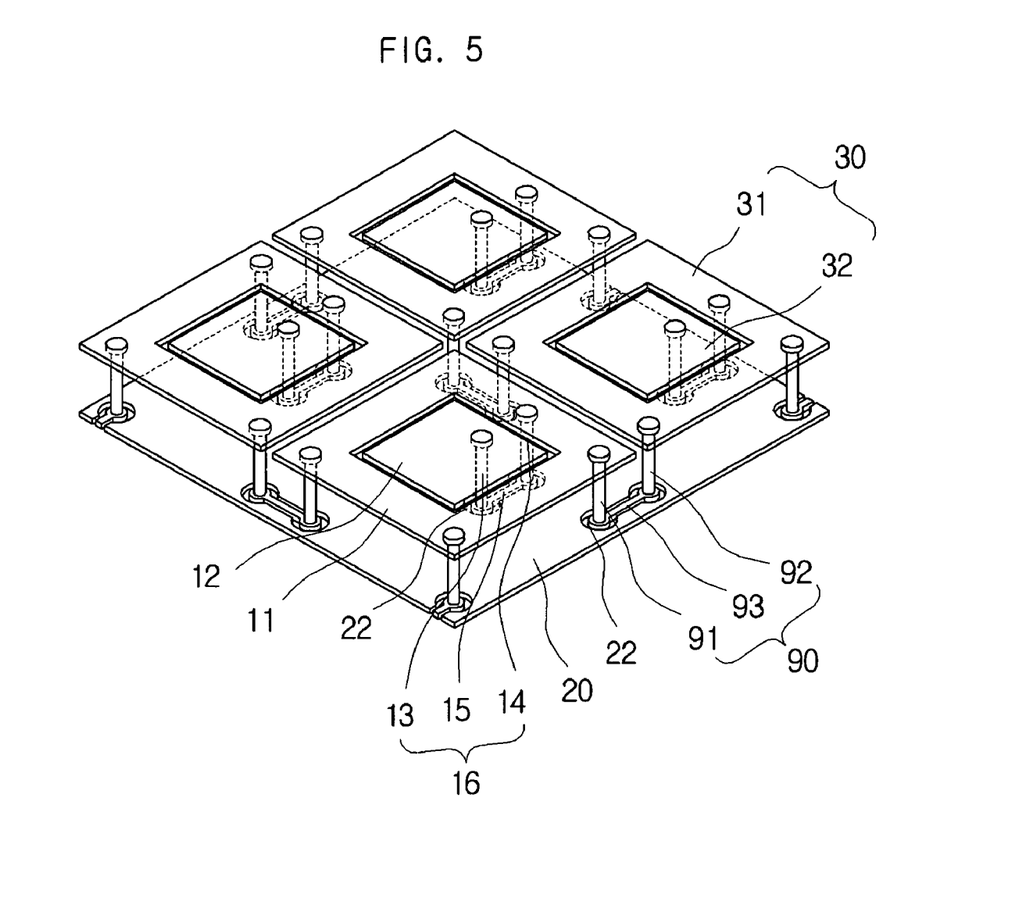
FIG. 5 is a perspective view showing a printed circuit board in accordance with an embodiment of the present invention.

As shown in FIG. 5, the first plate 11 is surrounded by the second plate 12. However, the present invention is not limited to this embodiment, and it is alternatively possible that the first plate 11 and the second plate 12 divide the space of the first conductor 10 into a left region and a right region, respectively.

Such stitching via structure can be applied to the third conductor 30 in addition to the first conductor 10. As shown in FIG. 5, the third conductor 30 can be also divided into two plates 31 and 32.

Figure 6:
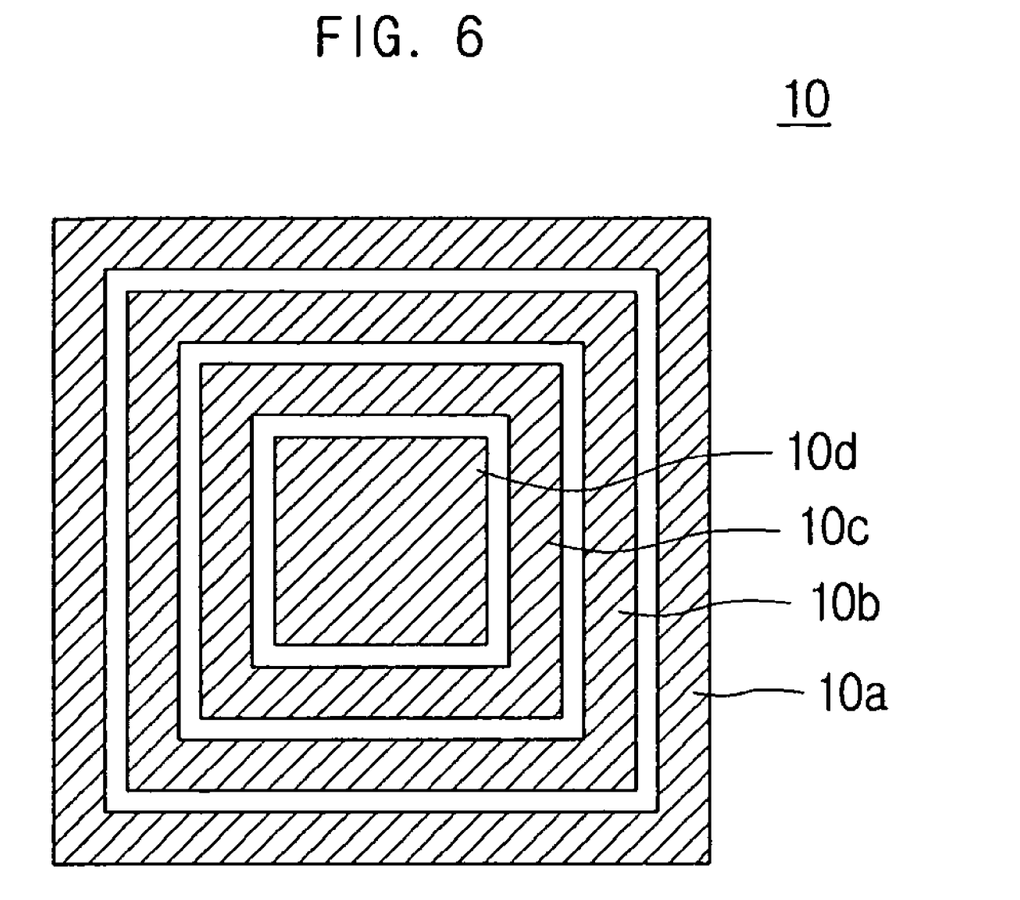
FIG. 6 is a plan view showing a printed circuit board in accordance with another embodiment of the present invention.

As described above, FIG. 5 shows that the first conductor 10 is constituted by the two plates 11 and 12. Alternatively, as shown in FIG. 6, the first conductor 10 can be constituted by 4 plates 10a, 10b, 10c, and 10d or more. In this case, the adjacent plates can be connected to each other by the aforementioned stitching via structure.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

Many other embodiments can be included in the scope of claims of the present invention.

What is claimed is:

1. A printed circuit board into which an electromagnetic bandgap structure for blocking a noise is inserted, the electromagnetic bandgap structure comprising:
    a first conductor and a second conductor arranged on different planar surfaces;
    a third conductor arranged on a planar surface that is different from a planar surface where the second conductor is arranged; and
    a first stitching via unit configured to connect the first conductor to the third conductor through the planar surface where the second conductor is arranged, the first stitching via unit being electrically separated from the second conductor,
    wherein the first conductor comprises:
        a first plate;
        a second plate spaced from the first plate; and
        a second stitching unit configured to electrically connect the first plate to the second plate through a planar surface that is different from a planar surface where the first plate and the second plate are arranged.

2. The printed circuit board of claim 1, wherein the second stitching via unit comprises:
    a connection pattern arranged on the planar surface that is different from the planar surface where the first plate and the second plate are arranged; and
    a pair of vias configured to connect opposite ends of the connection pattern to the first plate and the second plate, respectively.

3. The printed circuit board of claim 2, wherein the connection pattern is arranged on a same planar surface as the second conductor.

4. The printed circuit board of claim 1, wherein the first plate is surrounded by the second plate.

* * * * *